(12) United States Patent
Yu (10) Patent No.: US 6,888,201 B2
(45) Date of Patent: May 3, 2005

(54) BIPOLAR ESD PROTECTION STRUCTURE

(75) Inventor: Ta-Lee Yu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/790,919

(22) Filed: Mar. 2, 2004

(65) Prior Publication Data

US 2004/0169234 A1 Sep. 2, 2004

Related U.S. Application Data

(62) Division of application No. 10/266,665, filed on Oct. 8, 2002, now Pat. No. 6,720,625, which is a division of application No. 09/635,583, filed on Aug. 9, 2000, now Pat. No. 6,472,286.

(51) Int. Cl.$^7$ ............................................. H01L 23/62
(52) U.S. Cl. ...................... 257/361; 257/362; 257/363
(58) Field of Search ................................ 257/361–363, 257/355, 356

(56) References Cited

U.S. PATENT DOCUMENTS

| | | | |
|---|---|---|---|
| 5,301,084 A | 4/1994 | Miller | 361/91 |
| 5,341,005 A | 8/1994 | Canclini | 257/173 |
| 5,528,189 A | 6/1996 | Khatibzadeh | 327/314 |
| 5,850,095 A | 12/1998 | Chen et al. | 257/361 |
| 6,472,286 B1 | 10/2002 | Yu | |
| 6,720,625 B2 | 4/2004 | Yu | |

OTHER PUBLICATIONS

J. Chen et al., "Design and Layout of a High ESD Performance NPN Structure for Submicron BiCMOS/Bipolar Circuits", IEEE Jrnl 1996, 0–7803–2753–5/96, pp. 227–232.

Yu, Tai Lee, Co–Pending U.S. Appl. No. 10/790,925 filed Mar. 2, 2004.

Yu, Tai Lee, Response Under Rule 1.111 filed on Sep. 30, 2004 in Co–Pending U.S. Appl. No. 10/790,925.

*Primary Examiner*—Phat X. Cao
*Assistant Examiner*—Theresa T. Doan (57) ABSTRACT

The invention describes the fabrication and structure of an ESD protection device for integrated circuit semiconductor devices with improved ESD protection and resiliency. A vertical bipolar npn transistor forms the basis of the protection device. To handle the large current requirements of an ESD incident, the bipolar transistor has multiple base and emitter elements formed in an npn bipolar array. To assure turn-on of the multiple elements of the array the emitter fingers are continuously or contiguously connected with an unique emitter design layout. The contiguous emitter design provides an improved electrical emitter connection for the device, minimizing any unbalance that can potentially occur when using separate emitter fingers and improving the ability for the simultaneous turn on of the multiple emitter-base elements. The emitter is contained within the footprint of the collector elements, and enables containment of device size, therefore minimizing device capacitance characteristics important in high speed circuit design. Other embodiments of the invention use variations in the structure of the common contiguous emitter conductor as well as different base conductor structure layouts.

13 Claims, 5 Drawing Sheets

BIPOLAR ESD PROTECTION STRUCTURE

This is a division of patent application Ser. No. 10/266,665, filing date Oct. 8, 2002 now U.S. Pat. No. 6,720,625, which is a division of patent application Ser. No. 09/635,583, filing date Aug. 9, 2000 now U.S. Pat. No. 6,472,286, Bipolar ESD Protection Structure, assigned to the same assignee as the present invention, which are herein incorporated by reference in their entirety.

FIELD OF THE INVENTION

The present invention relates generally to the fabrication and structure of a semiconductor device for ESD protection of electronic circuit devices and more particularly to a continuous emitter bipolar device with improved ESD circuit protection characteristics.

DESCRIPTION OF PRIOR ART

Figure 3:
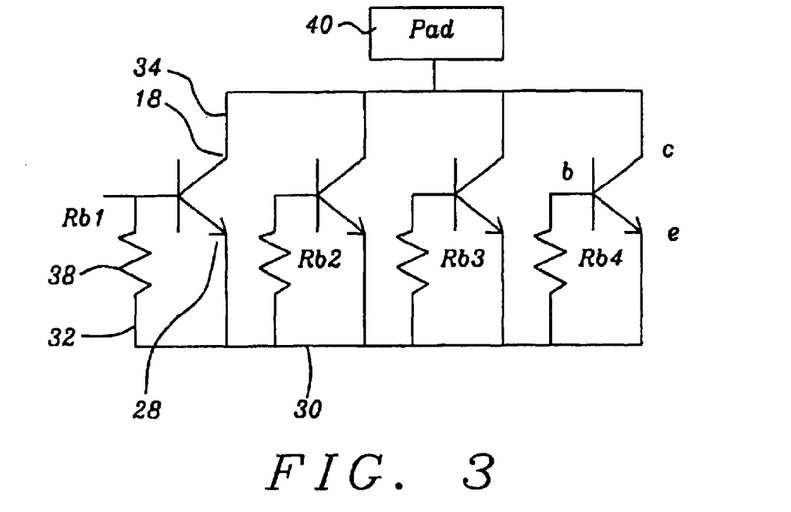
FIG. 3 shows a simplified equivalent circuit diagram of a multi finger bipolar ESD protection device with base and emitter elements tied to ground and collector connected to the chip integrated circuit input pad.

Because of high input impedance and thin oxide gate structures, the problem of Electrostatic Discharge (ESD) damage with field effect transistor (FET) devices can be severe. Therefore the input/output (I/O) circuit locations or pads usually have a protective device connected between the I/O pad and the internal circuits as shown in FIG. 3 which allows the ESD current to be shunted to ground. Another important characteristic of the ESD protection device is that it must not interfere with the operation of the devices it is designed to protect, while at the same time providing good protection when abnormal or ESD voltage incidents occur. Typical ESD protection devices consist of a n channel metal oxide semiconductor (NMOS) with an associated lateral parasitic npn bipolar transistor. Once triggered by an ESD incident, the device operates in the lateral npn mode to pass the high current. However, a vertical bipolar npn structure has better power dissipation capability than the NMOS, and is frequently used to provide ESD protection for the internal circuits.

Figure 1:
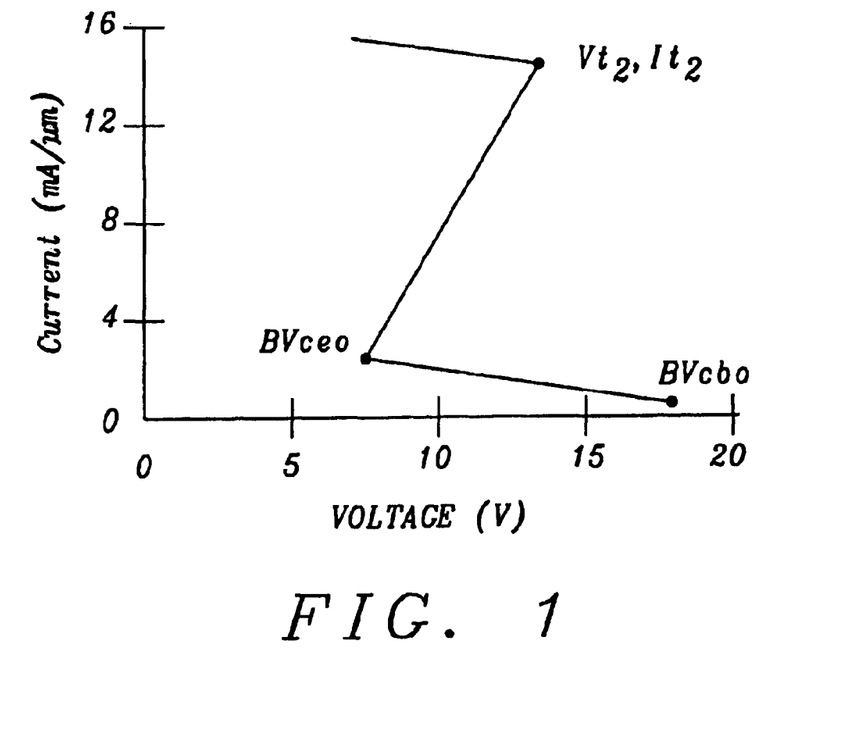
FIG. 1 represents the typical current (I) vs. voltage (V) characteristic for the vertical npn bipolar transistor with initial turn-on (Bvcbo), avalanche region (BVceo to Vt2, It2,) and secondary breakdown region beyond Vt2, It2.
Figure 4:
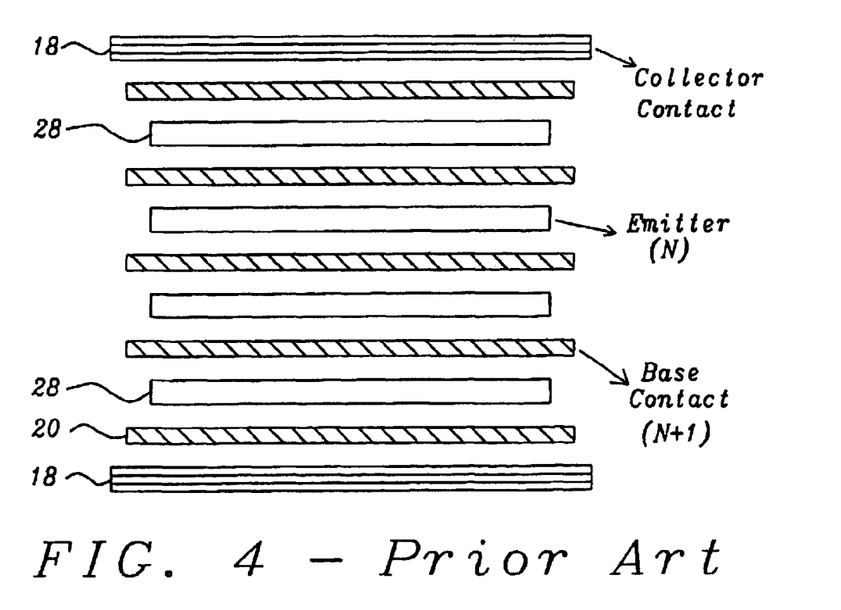
FIG. 4 is a top view of the horizontal layout of the prior art multifinger npn bipolar ESD protection device with the number of emitter fingers=4, and the number of base elements=5.

ESD efficiency is typically measured by dividing the ESD "threshold" voltage by the area of the ESD protection device as described in the report by Chen et al., "Design and Layout of High ESD Performance NPN Structure for Submicron BiCMOS/Bipolar Circuits.", IIIE Journal, 1996 0-7803-2753-5/96, pp. 227 to 232. ESD threshold can be correlated to the secondary breakdown characteristic of the bipolar transistor as depicted in FIG. 1. The initial collector base breakdown (Bvcbo) initiates the device turn on which is followed by breakdown of collector to emitter (BVceo) as conduction enters the avalanche region between BVceo and Vt2, It2. Vt2 and It2 define the beginning of the secondary breakdown region in which the npn can be damaged due to Joule heating of the collector base junction. The higher the It2, that is the current threshold prior to secondary breakdown, the higher the ESD threshold, the better the ESD characteristics of the device. It is found that an increase in It2 and hence ESD threshold, scales with emitter length. However, as emitter length is increased there is a corresponding increase in device area. This takes up valuable active circuit area, and results in increased device capacitance which is detrimental in high speed circuit operation. In an effort to control or reduce ESD device area while maintaining or improving ESD efficiency, prior art designs have used multiple emitter finger designs. The top view horizontal layout of one such design is depicted in FIG. 4. It is seen in FIG. 4 that there are N+1 base conductors 20 for every N emitter fingers 28. In the case shown, N=4 and therefore there are 5 base connections 20 running in a horizontal interdigitated fashion between the emitter fingers 28.

The schematic of FIG. 3 shows a simplified equivalent circuit of the device with the collectors 18 electrically tied together 34 and to the input pad 40. The bases 20 are tied to the emitters 28 through the base spreading resistance 38 depicted as resistors Rb1, Rb2, Rb3, and Rb4 and additional conductor elements 32. Typically the base and emitter elements are then connected to ground 30. The objective of the prior art layout is to optimize the design to make the base resistance as equal as possible (Rb1=Rb2=Rb3=Rb4) so that the emitters will turn on uniformly at the same time to conduct the ESD current. However, there are still four different emitter fingers 28 in FIG. 4 in which process variation can cause slight differences in electrical characteristics as well as in the characteristics of the base elements. This design structure therefore cannot always assure turn-on of all the emitter base elements to maximize the device ESD current capability.

It is desired to find a manufacturing method and device structure that maintains or improves the ESD efficiency of the multi emitter finger device with improved turn on characteristics and resistance to ESD damage.

U.S. Pat. No. 5,850,095 issued to Chen et al., describes an electrostatic discharge (ESD) protection circuit with a different emitter layout and structure from that described by the invention U.S. Pat. No. 5,341,005 issued to Canclini shows different structures for ESD protection.

U.S. Pat. No. 5,528,189 issued to Khatibzadeh., shows an amplifier with ESD protection with emitter finger layouts.

The following technical report previously referenced also refers to the subject of ESD protection.

"Design and Layout of High ESD Performance Circuits, IEEE, 1996 0-7803-2753-5/96 pp. 227 to 232. The report discusses various ESD protection device layouts.

SUMMARY OF THE INVENTION

Accordingly, it is the primary objective of the invention to provide an effective and manufacturable method and structure for improving semiconductor device resistance to the potential damage caused by the phenomenon known as electrostatic discharge (ESD) by utilizing a vertical bipolar npn transistor structure.

It is a further objective of the invention to improve ESD protection by providing a structure with higher ESD efficiency and be less susceptible to ESD damage.

Yet another objective of the invention is to provide a structure with improved ESD efficiency while at the same time maintaining or reducing structure size and capacitance which will enable reduced chip size and improved high speed performance.

A still additional objective of the invention is to provide the improved ESD protection without changing the characteristics of the internal circuits being protected and by using a process compatible with the process of integrated MOS device manufacturing.

The above objectives are achieved in accordance with the methods and structures of the invention which describes an ESD protection device for integrated circuit semiconductor devices with improved ESD protection and resiliency and a manufacturing method for the device. A vertical bipolar npn transistor forms the basis of the protection device. To handle the large current requirements of an ESD incident, the bipolar transistor has multiple base and emitter elements formed in a npn bipolar array. To assure turn-on of the multiple elements of the array the emitter fingers are continuously or contiguously connected with a unique emitter design layout structure. The contiguous emitter design provides an improved electrical emitter connection for the device, minimizing any unbalance that can potentially occur when using separate emitter fingers and improving the ability for the simultaneous turn on of the multiple emitter-base elements. The emitter is contained within the footprint of the collector elements, and enables containment of device size, therefore minimizing device capacitance characteristics important in high speed circuit design. Other embodiments of the invention use variations on the structure of the common contiguous emitter conductor as well as different base conductor structure layouts.

DESCRIPTION OF THE PREFERRED EMBODIMENTS

Figure 2:
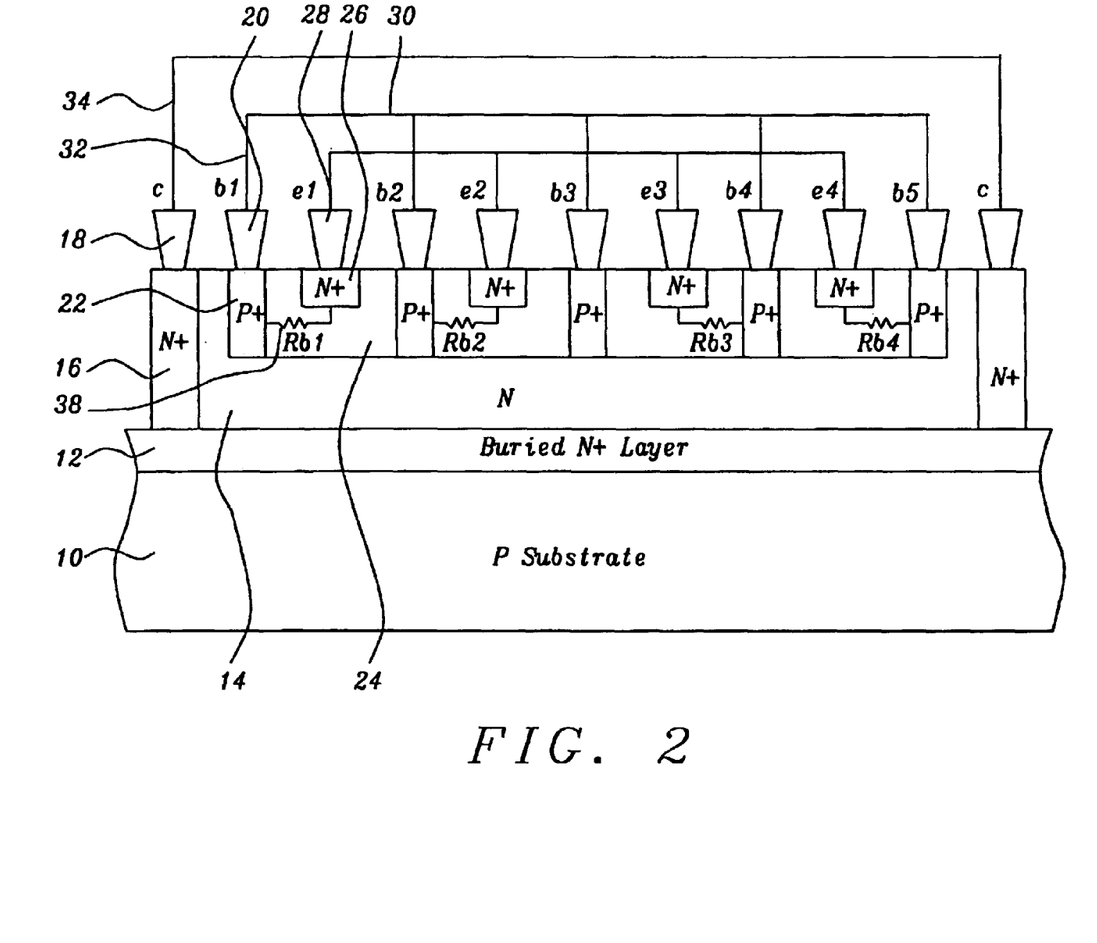
FIG. 2 is a cross section of a multi finger npn bipolar transistor structure.

FIG. 2 depicts a vertical cross section of a multiple element bipolar ESD protection device. The starting structure is a p doped substrate 10, typically created on a silicon wafer of 100 crystal orientation and with a doping level in the range of $10^{15}$ atoms per cubic centimeter (a/cm$^3$). A heavily doped n+ first semiconductor layer 12 called a buried layer or subcollector is formed upon the substrate typically using arsenic or antimony as impurity dopants and using either a chemical diffusion or an ion implant process. An ion implant process typically uses an implant energy in the range of 30 KeV with a dosage of $10^{15}$ atoms per square centimeter (a/cm$^2$) to produce a n+ buried layer doping level between $10^{18}$ and $10^{19}$ a/cm$^3$. Next, a light to moderately doped n type epitaxial second semiconductor layer 14 is deposited with a doping level typically in the range of $10^{15}$ to $10^{16}$ a/cm$^3$ with arsenic frequently being used as the dopant source element. A plurality of deep n+ regions 16 are implanted into the second semiconductor layer 14 beneath the collector contact regions typically using either an arsenic, antimony or phosphorous dopant with an implant energy in the range of 30 KeV with a dosage of $10^{15}$ a/cm$^2$ to produce an n+ region doping level between $10^{18}$ and $10^{19}$ a/cm$^3$. This provides a low resistance path to the surface conductor system 34 for the collector current. The structure processing is continued by implanting a third semiconductor layer 24 of p dopant, usually boron, with an implant energy in the range of 30 KeV with a dosage of $10^{14}$ a/cm$^2$ to produce a p layer with a typical impurity concentration in a range of between $10^{17}$ and $10^{18}$ a/cm$^3$ to form the transistor base regions. This is followed by implanting a plurality of p+ regions 22 using boron as a source with doping levels typically between $10^{18}$ and $10^{19}$ a/cm$^3$ within the third semiconductor layer base region 24 to form high conductivity regions for the base electrical contacts 20. Next, a plurality of third n doped semiconductor regions 26 is implanted, typically with phosphorous, with an implant energy in the range of 30 KeV and with a dosage of between $10^{16}$ and $10^{17}$ a/cm$^2$ to produce a p layer with a typical impurity concentration in a range of between $10^{19}$ and $10^{20}$ a/cm$^3$ for the transistor emitter regions 26. The electrical contacts with the surface conductors for the collector 18, base 20, and emitter 28 are typically made by using a refractory metal silicide such as titanium silicide (TiSi$_2$) or tungsten silicide (WSi$_2$) together with doped polysilicon (poly) or aluminum conductor elements.

A simplified electrical schematic of the ESD device is depicted in FIG. 3. The emitters 28 are normally connected together through a conductor system 30 and to a second voltage source, typically ground. The base contacts 20 are normally connected together through a base conductor system 32 and to the emitter conductor system 28 and then to ground 30. The base resistance 38 (Rb1, Rb2, Rb3, Rb4 for the structure depicted) represent the base spreading resistance, the electrical resistance of the conducting area of the base regions. It is the small differences in the base resistance's as well as the slight differences in the emitter contact resistance's and other device parameters such as gain that tend to prevent complete turn on of all the multi-finger emitter-base elements prior art designs.

The top horizontal topography of the prior art configuration is shown in FIG. 4. The example shown is for a N emitter element 28 bipolar transistor with N equal to 4. The figure shows four horizontal individual emitter fingers 28 on the top surface together with N+1 or five horizontal inter-digitated base fingers 20 and two horizontal collector fingers 18. The final electrical connections whereby the collectors are tied together and to an input pad and the emitters and base elements are tied together and connected to a second voltage source, typically ground, are not shown in this top horizontal view of the device layout. In this prior art layout great care must be exercised in the design and processing in order to have all the electrical parameters such as base resistance match as closely as possible in order to have as many emitter fingers 28 as possible turn on simultaneously.

Figure 5A:
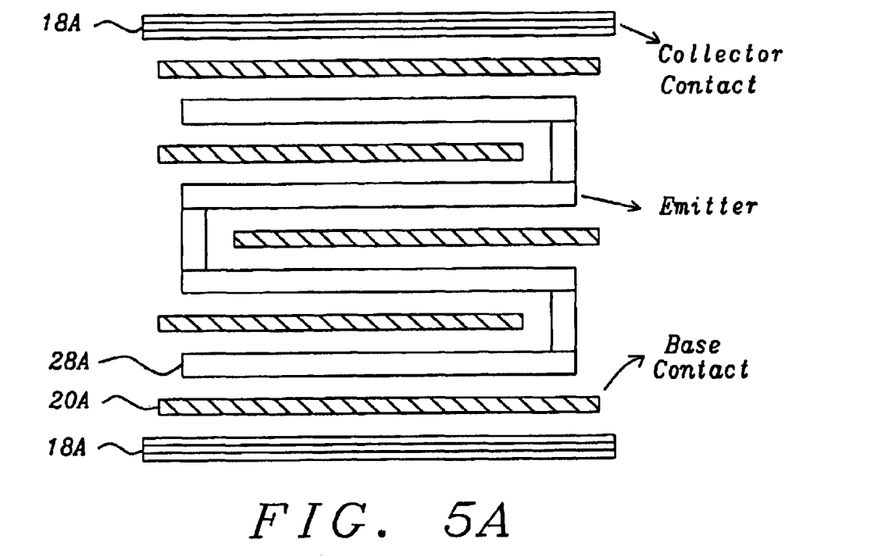
FIGS. 5A through 5D are top views of the horizontal layouts or topography of different embodiments of the invention bipolar ESD protection device.

FIG. 5A shows a top view horizontal layout of one embodiment of this invention with N, the number of emitter regions again being equal to four. These emitter regions 26 in FIG. 2 are connected together with vertical conductors on alternate ends of the emitter horizontal conductor stripes to form a continuous serpentine emitter 28A. The base conductors 20A are interdigitated on each side of the serpentine emitter 28A with N+1 elements or 5 for the case shown. The collector electrical contact conductors 18A are two horizontal conductors, one at the top and one at the bottom of the device. Not shown in FIG. 5A are the additional collector electrical connections shown in FIG. 3 which connect the collectors 34 together and to a first voltage source, the I/O pad 40, and the conductor 32 which connects the serpentine emitter 28A to the base conductor elements 20A and to the second voltage source, ground 30. The continuous serpentine emitter conductor 28A provides the capability of a single emitter current which provides a high assurance that all the base elements will conduct minimizing the possibility of localized device damage caused by excessive current, and therefore excessive joule heating, in any one transistor element. This provides good ESD protection while at the same time minimizing the device area.

Figure 5B:
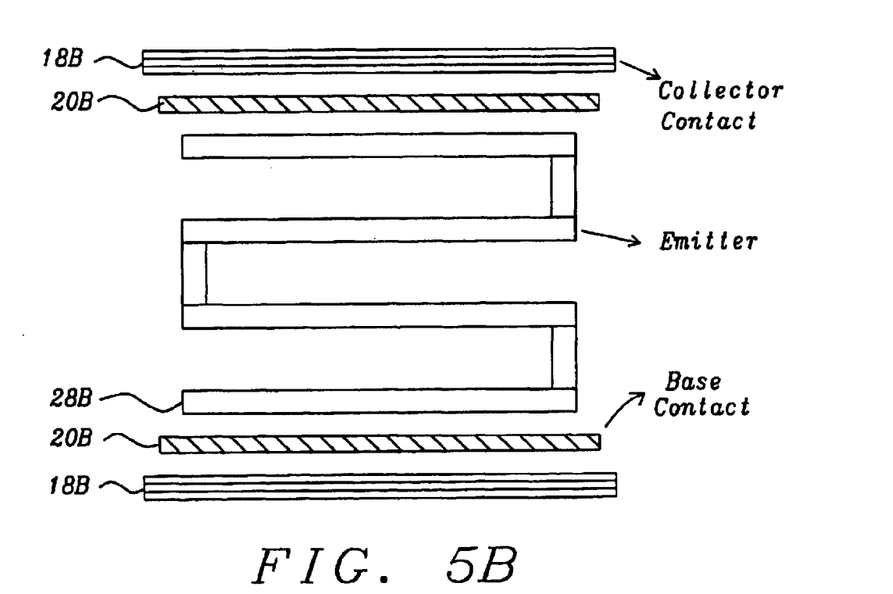

Another embodiment of the invention is shown in FIG. 5B. The serpentine emitter 28B is connected with vertical conductors at alternate sides of the horizontal emitter fingers the same as previously shown. However, the interdigitated base fingers 20A shown in FIG. 5A are removed leaving only two horizontal base fingers 20B on the top and bottom of the configuration between the top and bottom horizontal collector conductor stripes 18B and the continuous serpentine emitter conductor 28B. This improves semiconductor action which otherwise might be impaired by having too many base elements within the emitter regions.

Again not shown in FIG. 5B are the additional collector electrical connections shown in FIG. 3 which connect the collectors 34 together and to a first voltage source, the I/O pad 40. Also not shown is the conductor 32 which connects the serpentine emitter 28B to the base conductor elements 20B and to the second voltage source, ground 30.

Figure 5C:
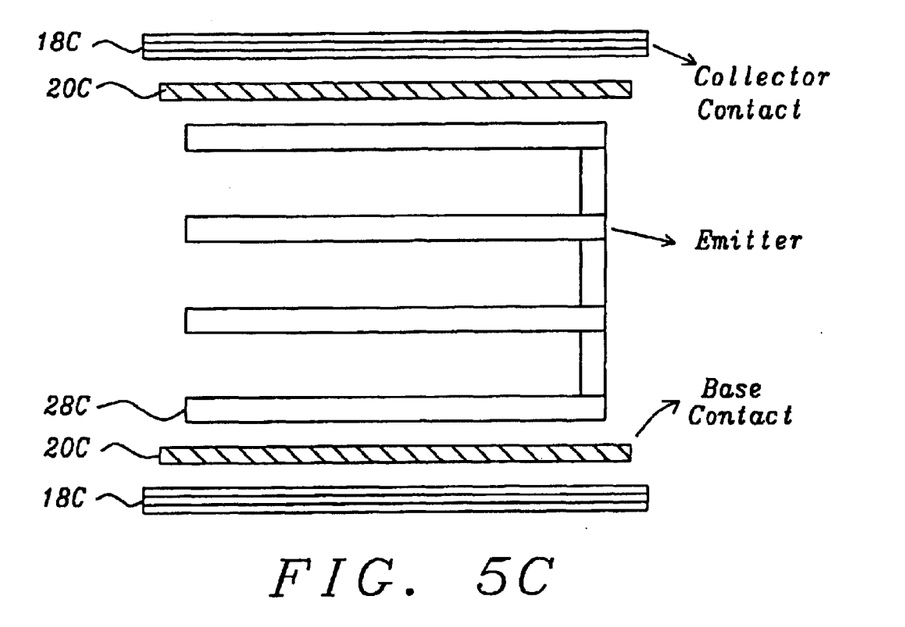

Yet another embodiment is shown in the top horizontal layout view depicted in FIG. 5C where the emitter has the horizontal emitter fingers 28C being connected at one end, the right end depicted in the figure FIG. 5C, forming a contiguous connection with a fork or comb like arrangement. Again, the base fingers 20C appear as horizontal contact conductors at the top and bottom of the layout between the horizontal top and bottom collector contact conductors 18C and the contiguous emitter contact conductor 28C. This shows the flexibility of the contiguous emitter conductor design layout. As an alternative, the emitter vertical conduction paths could be connected on the left side of the horizontal emitter finger array.

Again not shown in FIG. 5C are the additional collector electrical connections shown in FIG. 3 which connect the collectors 34 together and to a first voltage source, the I/O pad 40. Also not shown is the conductor 32 which connects the serpentine emitter 28C to the base conductor elements 20C and to the second voltage source, ground 30.

Figure 5D:
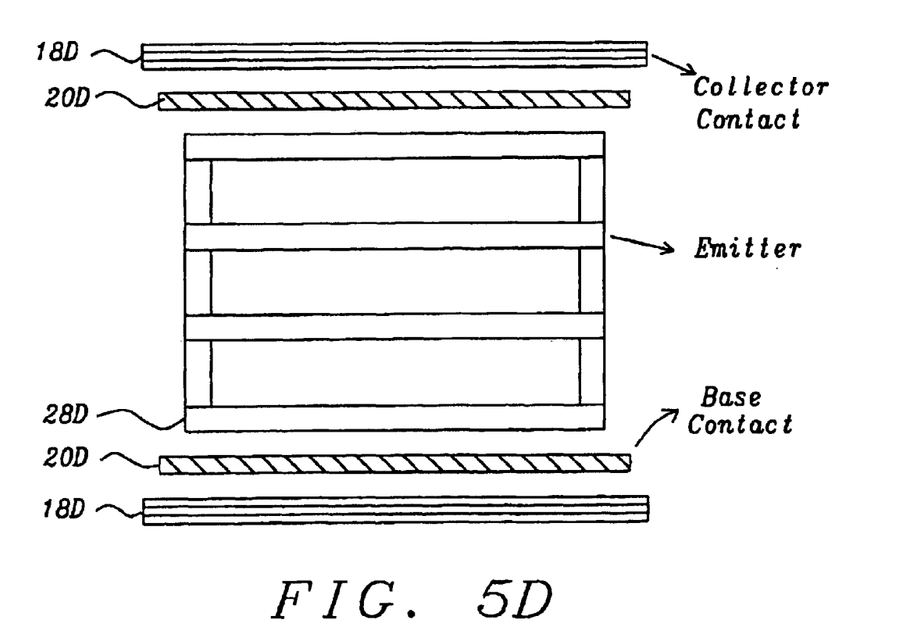

FIG. 5D shows yet another embodiment of the invention with the horizontal emitter finger contact conductors 28D being connected on both ends of the structure forming a border or box shape with grids. Once again, the base has two horizontal finger contact conductors 20D at the top and bottom of the structure between the horizontal top and bottom collector contact conductors 18D and the continuous emitter contact conductor 28D. This embodiment shows the flexibility of the contiguous emitter conductor design. In this case, more contact area is available to handle higher ESD currents if required. The invention provides the capability to have design tradeoffs between greater contact/conductor area for high current handling with minimum resistance encountered, and possibly less area with less capacitance for higher performance. Again, the final electrical conductor system connecting the emitters and base elements to ground and the collector to the input pad are not shown in FIG. 5D.

While the invention has been particularly shown and described with reference to the preferred embodiments thereof, it will be understood by those skilled in the art that various changes in form and details may be made without departing from the spirit and scope of the invention.

What is claimed is:

1. An integrated multiple vertical npn transistor ESD protection structure on a semiconductor substrate, functionally connected between an integrated circuit input or output pin and ground which will prevent electrostatic discharge damage to said integrated circuit comprising:
   a first semiconductor layer having a first conductivity dopant dopent type;
   a second semiconductor layer overlying said first semiconductor layer, having a similar conductivity type as said first layer, but a different dopant concentration;
   a third semiconductor layer having a second conductivity dopant type opposite that of said first semiconductor layer, disposed in overlying relation to said second semiconductor layer;
   a plurality of first regions of said first conductivity type electrically connecting with said first semiconductor layer, having a top element making electrical contact to said first regions and said first semiconductor layer;
   a plurality of second regions of said second conductivity dopant type laterally spaced from said first regions, being electrically connected to said third semiconductor layer having a top element making electrical contact to said second regions and said second semiconductor layer; and
   a plurality of third regions of said first semiconductor layer conductivity dopant type laterally spaced and interposed between said second regions,
   wherein said third regions form multiple emitter elements, said multiple emitter elements being electrically connected by a conductor element with "N" horizontal stripe conductor elements connected in a contiguous comb like manner by a vertical contact conductor element at one end of said horizontal stripe conductor elements.

2. The ESD protection structure of claim 1 whereby the plurality of first regions together with the associated connected first semiconductor layer are with n dopant and form multiple collector elements of a bipolar transistor array in which the base elements are formed by said third semiconductor layer and associated said plurality of second regions of p dopant.

3. The ESD protection structure of claim 2 whereby said plurality of laterally spaced third regions by which said multiple emitter elements are formed are arranged in an alternating array within said third semiconductor layer, with "N" number of emitter regions whereby "N" corresponds to the number of multiple bipolar transistors in an electrically parallel transistor array that comprise said ESD protection structure.

4. The ESD protection structure of claim 3 whereby said collector elements have horizontal contact conductor stripes at the top and bottom of said transistor array which are ultimately connected together and to a first voltage source of said integrated circuit input or output pin.

5. The ESD protection structure of claim 4 whereby said base elements have horizontal conductor contact stripes, a first base horizontal conductor contact stripe positioned between the bottom horizontal collector contact stripe and said "N" horizontal stripe conductor elements and a second base horizontal conductor contact stripe positioned between the top horizontal collector contact stripe and said "N" horizontal stripe conductor elements.

6. The ESD protection structure of claim 5 whereby said base horizontal conductor contact stripes and said multiple emitter elements connected together and to a second voltage source.

7. An integrated multiple vertical npn transistor ESD protection structure on a semiconductor substrate comprising:
   a first semiconductor layer having a first conductivity type with a first dopant concentration;
   a second semiconductor layer overlying said first semiconductor layer, said second semiconductor layer having said first conductivity type with a second dopant concentration;
   a third semiconductor layer overlying said second semiconductor layer, said third semiconductor layer having a second conductivity type;

a plurality of first regions of said first conductivity type electrically connecting with said first semiconductor layer, having a first top element making electrical contact to said first regions and said first semiconductor layer;

a plurality of second regions of said second conductivity type laterally spaced from said first regions, being electrically connected to said third semiconductor layer having a second top element making electrical contact to said second regions and said second semiconductor layer; and a plurality of third regions of said first semiconductor layer conductivity type laterally spaced and interposed between said second regions, wherein said third regions form multiple emitter elements, said multiple emitter elements being electrically connected by a conductor element with "N" horizontal stripe conductor elements connected in a contiguous comb like manner by a vertical contact conductor element at one end of said horizontal stripe conductor elements.

8. The ESD protection structure of claim 7 whereby the plurality of first regions together with the associated connected first semiconductor layer are with n dopant and form multiple collector elements of a bipolar transistor array in which the base elements are formed by said third semiconductor layer and associated said plurality of second regions, said second regions having p dopant.

9. The ESD protection structure of claim 8 whereby said plurality of laterally spaced third regions by which said multiple emitter elements are formed are arranged in an alternating array within said third semiconductor layer, with "N" number of emitter regions whereby "N" corresponds to the number of multiple bipolar transistors in an electrically parallel transistor array that comprise said ESD protection structure.

10. The ESD protection structure of claim 9 whereby said collector elements have horizontal contact conductor stripes at the top and bottom of said transistor array which are ultimately connected together and to a first voltage source of an input or output pin of an integrated circuit for preventing electrostatic discharge damage to said integrated circuit.

11. The ESD protection structure of claim 10 whereby said base elements have horizontal conductor contact stripes, a first base horizontal conductor contact stripe positioned between the bottom horizontal collector contact stripe and said "N" horizontal stripe conductor elements and a second base horizontal conductor contact stripe positioned between the top horizontal collector contact stripe and said "N" horizontal stripe conductor elements.

12. The ESD protection structure of claim 11 whereby said base horizontal conductor contact stripes and said multiple emitter elements are connected together and to a second voltage source.

13. The ESD protection structure of claim 12, wherein said second voltage source is ground.

* * * * *

UNITED STATES PATENT AND TRADEMARK OFFICE
CERTIFICATE OF CORRECTION

PATENT NO. : 6,888,201 B2
DATED : May 3, 2005
INVENTOR(S) : Yu

It is certified that error appears in the above-identified patent and that said Letters Patent is hereby corrected as shown below:

Column 4,
Line 27, insert -- in -- after the word "elements"; and

Column 5,
Line 64, delete "dopent"

Signed and Sealed this

Twelfth Day of July, 2005

JON W. DUDAS
*Director of the United States Patent and Trademark Office*